United States Patent
Shen

(10) Patent No.: US 7,176,573 B2
(45) Date of Patent: Feb. 13, 2007

(54) SEMICONDUCTOR DEVICE WITH A MULTI-LEVEL INTERCONNECT STRUCTURE AND METHOD FOR MAKING THE SAME

(76) Inventor: Yu-Nung Shen, 4F, No. 52, Sec. 2, Chung-Shan N. Rd., Taipei City (TW)

( * ) Notice: Subject to any disclaimer, the term of this patent is extended or adjusted under 35 U.S.C. 154(b) by 0 days.

(21) Appl. No.: 10/716,948

(22) Filed: Nov. 19, 2003

(65) Prior Publication Data

US 2004/0135257 A1    Jul. 15, 2004

(30) Foreign Application Priority Data

Nov. 22, 2002   (TW)   ................................ 91134054 A

(51) Int. Cl.
*H01L 23/48*   (2006.01)
(52) U.S. Cl. ....................................................... 257/758
(58) Field of Classification Search ................. 257/758, 257/734–738, 700; 438/118
See application file for complete search history.

(56) References Cited

U.S. PATENT DOCUMENTS 6,175,159 B1 * 1/2001 Sasaki ......................... 257/778
6,713,859 B1 * 3/2004 Ma ............................. 257/687

* cited by examiner

*Primary Examiner*—Nathan W. Ha

(57) ABSTRACT

A semiconductor device includes a semiconductor die and a multi-level interconnect structure that has a first insulating layer formed on the die, conductive horizontal bodies, each of which is connected to a respective bonding pad of the die and has an extension formed on the first insulating layer, a second insulating layer formed on the first insulating layer, and conductive vertical bodies, each of which is connected to the extension of a respective conductive horizontal body and extends through the second insulating layer.

20 Claims, 4 Drawing Sheets

SEMICONDUCTOR DEVICE WITH A MULTI-LEVEL INTERCONNECT STRUCTURE AND METHOD FOR MAKING THE SAME

CROSS-REFERENCE TO RELATED APPLICATION

This application claims priority of Taiwanese Patent Application No. 091134054, filed on Nov. 22, 2002.

BACKGROUND OF THE INVENTION

1. Field of the Invention

This invention relates to a semiconductor device, and more particularly to a semiconductor device with a multi-level interconnect structure and to a method for making the same.

2. Description of the Related Art

With the increase of functions in a highly integrated semiconductor chip and with the decrease in the size of the semiconductor chip, not only the distance between adjacent bonding pads formed on the semiconductor chip is getting smaller. However, electrical contacts on an external electronic device, especially, a wiring substrate, and the distance between adjacent electrical contacts, are unable to be as small as the bonding pads on the semiconductor chip. As a consequence, connecting the bonding pads formed on the semiconductor chip to the electrical contacts formed on the external electronic devices through solder bumps becomes very difficult, and short circuit tends to occur, which leads to lower production yield.

SUMMARY OF THE INVENTION

The object of the present invention is to provide a semiconductor device that is capable of overcoming the aforesaid drawback of the prior art.

Another object of the present invention is to provide a method for making the semiconductor device.

According to one aspect of the present invention, there is provided a semiconductor device that comprises: a semiconductor die having a pad-mounting surface defining a horizontal plane, and a plurality of spaced apart bonding pads formed on the pad-mounting surface; and a multi-level interconnect structure formed on the pad-mounting surface. The multi-level interconnect structure includes: a first insulating layer formed on the pad-mounting surface and formed with a plurality of holes, each of which exposes a respective one of the bonding pads from the pad-mounting surface; a plurality of first level conductive horizontal bodies, each of which has an end section that fills a respective one of the holes to electrically connect with a respective one of the bonding pads, and an extension that extends from the end section, that is formed on the first insulating layer, and that has a connecting end horizontally offset from the respective one of the holes; a second insulating layer formed on the first insulating layer and formed with a plurality of holes, each of which exposes the connecting end of the extension of a respective one of the first level conductive horizontal bodies from the second insulating layer; and a plurality of second level conductive vertical bodies, each of which fills a respective one of the holes in the second insulating layer to electrically connect with the connecting end of the extension of a respective one of the first level conductive horizontal bodies, and each of which has a connecting end that extends through the respective one of the holes in the second insulating layer.

According to another aspect of the present invention, there is provided a method for making a semiconductor device that includes a semiconductor die having a pad-mounting surface defining a horizontal plane and a plurality of bonding pads formed on the pad-mounting surface. The method comprises the steps of: forming a first insulating layer on the pad-mounting surface; forming a plurality of holes in the first insulating layer, each of the holes exposing a respective one of the bonding pads from the first insulating layer; forming a plurality of first level conductive horizontal bodies, each of which has an end section that fills a respective one of the holes to electrically connect with a respective one of the bonding pads, and an extension that extends from the end section, that is formed on the first insulating layer, and that has a connecting end horizontally offset from the respective one of the holes; forming a second insulating layer on the first insulating layer; forming a plurality of holes in the second insulating layer, each of the holes in the second insulating layer exposing the connecting end of the extension of a respective one of the first level conductive horizontal bodies; and forming a plurality of second level conductive vertical bodies, each of which is electrically connected to the connecting end of the extension of a respective one of the first level conductive horizontal bodies, each of which fills a respective one of the holes in the second insulating layer, and each of which has a connecting end that extends through the respective one of the holes in the second insulating layer.

BRIEF DESCRIPTION OF THE DRAWINGS

In drawings which illustrate an embodiment of the invention.

DETAILED DESCRIPTION OF THE PREFERRED EMBODIMENT

FIGS. 1 to 8 illustrate consecutive steps of forming the preferred embodiment of a semiconductor device according to the method of this invention. The semiconductor device includes a semiconductor die 1 having a pad-mounting surface 10 and a plurality of spaced apart first and second bonding pads 11, 12 (see FIG. 3) formed on the pad-mounting surface 10, and a multi-level interconnect structure which is formed according to the following steps of the method of this invention. Note that the semiconductor die 1 can be replaced with a semiconductor wafer.

Figure 1:
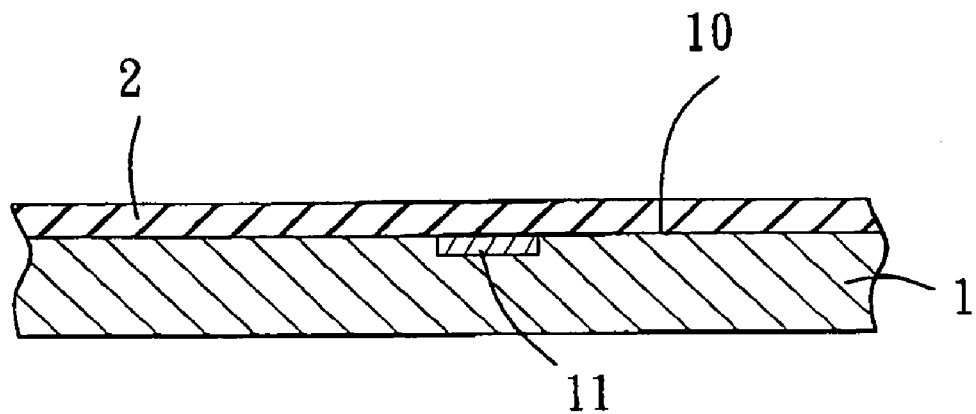
FIG. 1 is a schematic view to illustrate how a first insulating layer is formed on a semiconductor die of the preferred embodiment of a semiconductor device according to the method of this invention.
Figure 2:
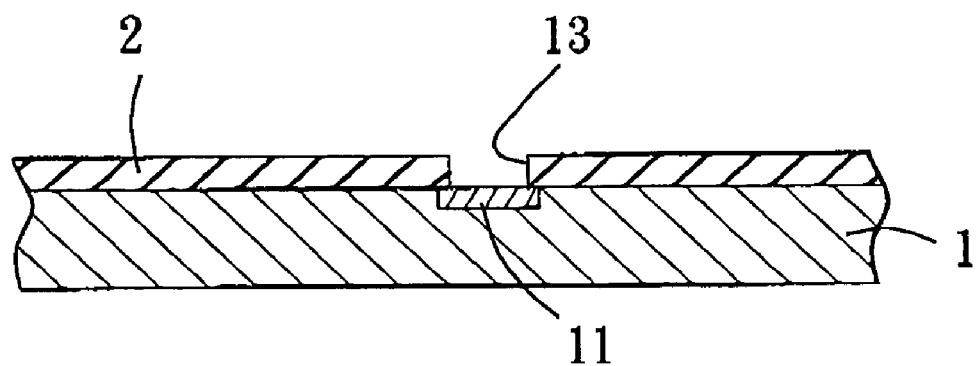
FIG. 2 is a schematic view to illustrate how holes are formed in the first insulating layer according to the method of this invention.
Figure 3:
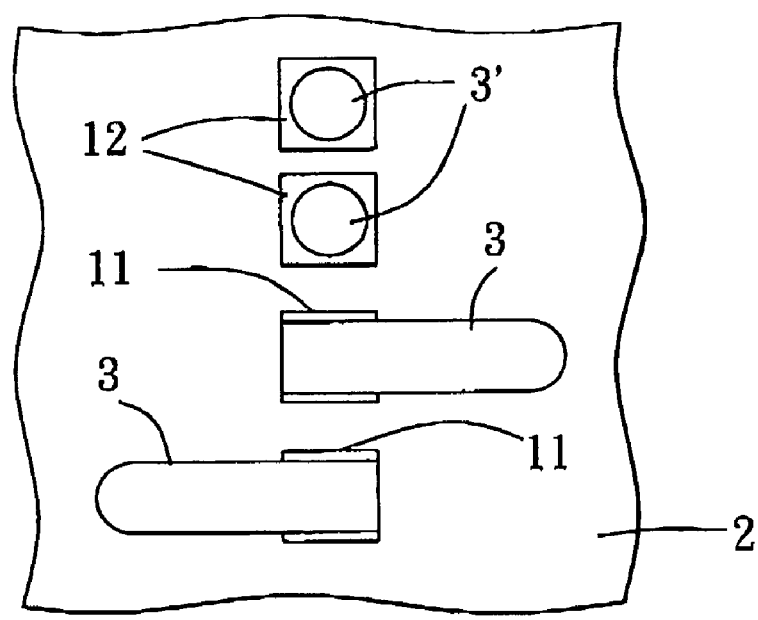
FIGS. 3 and 4 are schematic views to illustrate how first level conductive horizontal and vertical bodies are formed on the first insulating layer according to the method of this invention.
Figure 4:
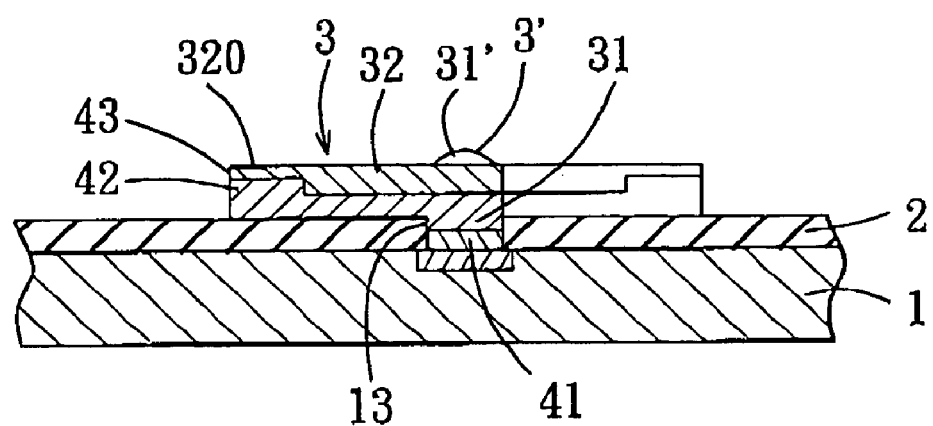
Figure 5:
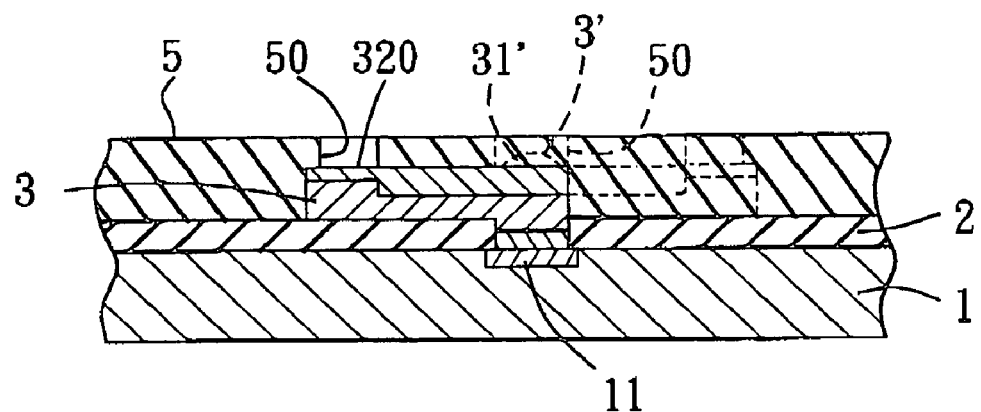
FIG. 5 is a schematic view to illustrate how a second insulating layer is formed on the first insulating layer according to the method of this invention.
Figure 6:
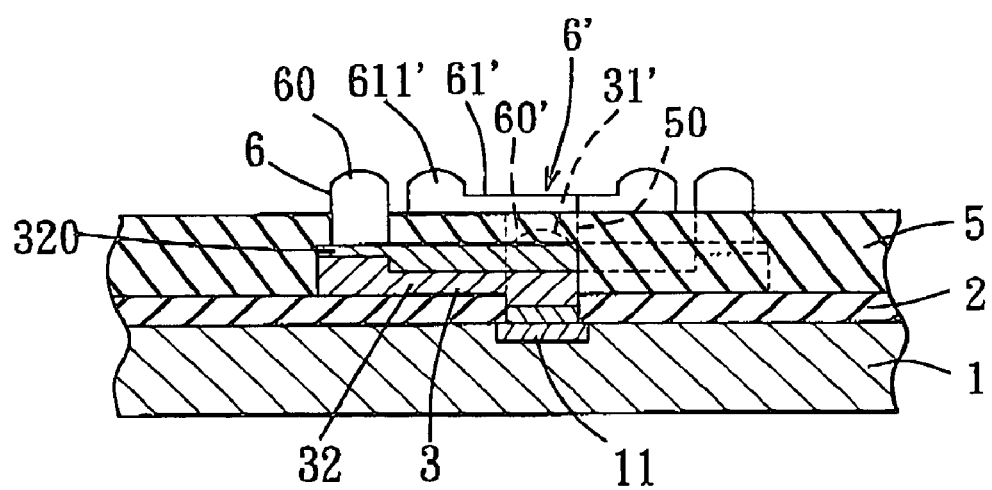
FIG. 6 is a schematic view to illustrate how second level conductive horizontal and vertical bodies are formed on the second insulating layer according to the method of this invention.
Figure 7:
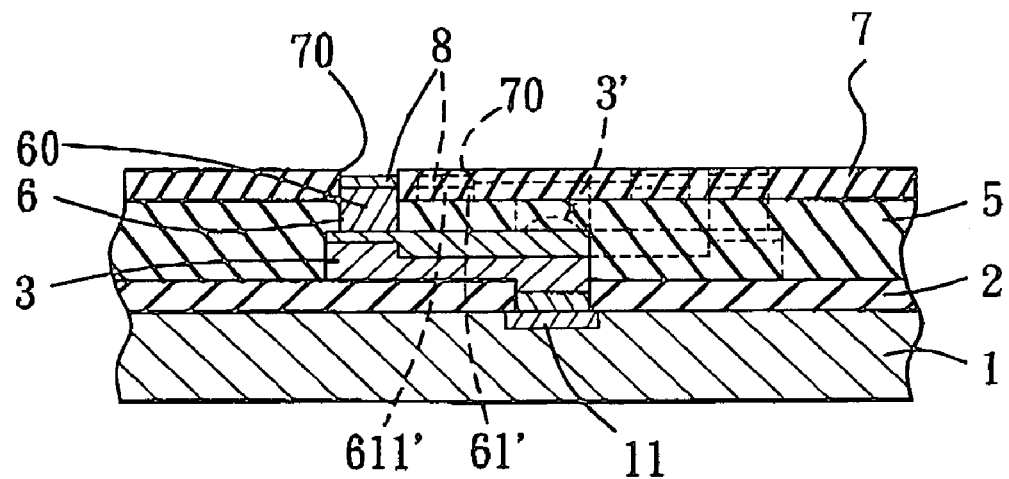
FIG. 7 is a schematic view to illustrate how a third insulating layer is formed on the second insulating layer according to the method of this invention.
Figure 8:
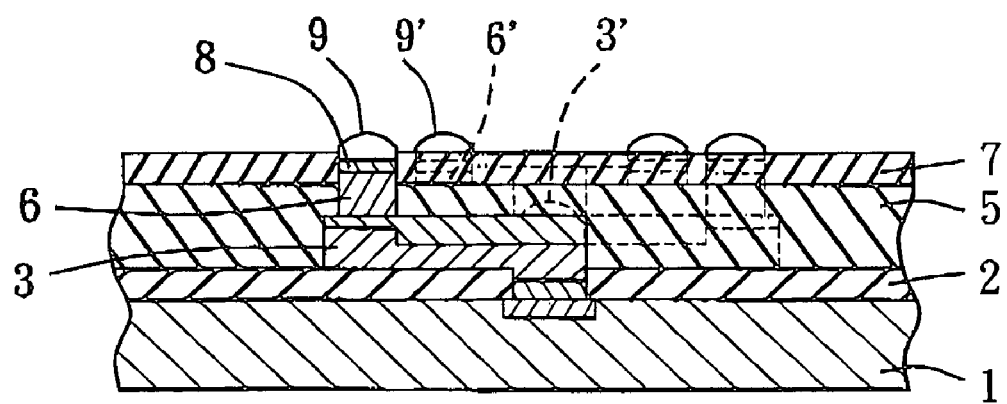
FIG. 8 is a schematic view to illustrate how conductive bumps are formed on the second level conductive horizontal and vertical bodies according to the method of this invention.

The method includes the steps of: forming a first insulating layer 2 of a photoresist material on the pad-mounting surface 10 (see FIG. 1); forming a plurality of first and second holes 13 in the first insulating layer 2 through etching techniques (only one of the first and second holes 13 is shown in FIG. 2), each of the first and second holes 13 exposing a respective one of the first and second bonding pads 11, 12 from the first insulating layer 2; forming a plurality of first metal layers 41 on the first bonding pads 11, respectively, through plating techniques; forming a plurality of first level conductive horizontal bodies 3 (see FIGS. 3 and 4), each of which has an end section 31 that fills a respective one of the first holes 13 to electrically connect with a respective one of the first bonding pads 11 through a respective first metal layer 41, and an extension 32 that extends from the end section 31, that is formed on the first insulating layer 2, and that has a connecting end 320 horizontally offset from the respective one of the first holes 13, each of the first level conductive horizontal bodies 3 including a conductive paste layer 42 that has a first portion extending from the first metal layer 41, and a second portion formed on the first insulating layer 2, and a second metal layer 43 formed on and cooperating with the second portion of the conductive paste layer 42 to define the extension 32 of the respective one of the first level conductive horizontal bodies 3, the connecting end 320 of the extension 32 of each of the first level conductive horizontal bodies 3 being flattened, the second metal layer 43 preferably including a nickel sub-layer and a gold sub-layer (not shown); forming a plurality of first level conductive vertical bodies 3', each of which fills a respective one of the second holes 13 in the first insulating layer 2 to electrically connect with a respective one of the second bonding pads 12 (see FIGS. 3 and 4), and each of which has a connecting end 31' that extends through the respective one of the second holes 13 in the first insulating layer 2; forming a second insulating layer 5 of the photoresist material on the first insulating layer 2 (see FIG. 5); forming a plurality of first and second holes 50 in the second insulating layer 5 (see FIG. 5), each of the first holes 50 in the second insulating layer 5 exposing the connecting end 320 of the extension 32 of a respective one of the first level conductive horizontal bodies 3, each of the second holes 50 in the second insulating layer 5 exposing the connecting end 31' of a respective one of the first level conductive vertical bodies 3'; forming a plurality of second level conductive vertical bodies 6 (see FIG. 6), each of which is electrically connected to the connecting end 320 of the extension 32 of a respective one of the first level conductive horizontal bodies 3, each of which fills a respective one of the first holes 50 in the second insulating layer 5, and each of which has a connecting end 60 that extends through and that is vertically aligned with the respective one of the first holes 50 in the second insulating layer 5; forming a plurality of second level conductive horizontal bodies 6' (see FIG. 6), each of which has an end section 60' that fills a respective one of the second holes 50 in the second insulating layer 5 to electrically connect with the connecting end 31' of a respective one of the first level conductive vertical bodies 3', and an extension 61' that extends from the end section 60' of a respective one of the second level conductive horizontal bodies 6', that is formed on the second insulating layer 5, and that has a connecting end 611' horizontally offset from the respective one of the second holes 50 in the second insulating layer 5, the connecting end 611' of the extension 61' of each of the second level conductive horizontal bodies 6' being flattened; forming a third insulating layer 7 of the photoresist material on the second insulating layer 5 (see FIG. 7); forming a plurality of first and second holes 70 in the third insulating layer 7 (see FIG. 7) such that the connecting end 60 of each of the second level conductive vertical bodies 6 and the connecting end 611' of the extension 61' of each of the second level conductive horizontal bodies 6' extend into a respective one of the first and second holes 70 in the third insulating layer 7; forming a third metal layer 8 on the connecting end 60 of each of the second level conductive vertical bodies 6 and on the connecting end 611' of the extension 61' of each of the second level conductive horizontal bodies 6' (see FIG. 7); and forming a plurality of first and second conductive bumps 9, 9' (see FIG. 8) such that each of the first conductive bumps 9 extends into a respective one of the first holes 70 in the third insulating layer 7 to electrically connect with the connecting end 60 of a respective one of the second level conductive vertical bodies 6 through the third metal layer 8, and that each of the second conductive bumps 9' extends into a respective one of the second holes 70 in the third insulating layer 7 to electrically connect with the connecting end 611' of the extension 61 of a respective one of the second level conductive horizontal bodies 6' through the third metal layer 8. Note that the multi-level interconnect structure is not limited to the above preferred embodiment, and can include more levels of the insulating layers and the conductive horizontal and vertical bodies.

With the formation of the multi-level interconnect structure on the semiconductor die 1, connection of external electronic devices (not shown) to the bonding pads 11 of the semiconductor die 1 can be shifted to the first and second conductive bumps 9, 9', which are wider in distance between adjacent ones as compared to the bonding pads 11. As such, the aforementioned drawback as encountered in the prior art can be eliminated.

With the invention thus explained, it is apparent that various modifications and variations can be made without departing from the spirit of the present invention. It is therefore intended that the invention be limited only as recited in the appended claims.

I claim:

1. A semiconductor device comprising:
   a semiconductor die having a pad-mounting surface defining a horizontal plane, and a plurality of spaced apart first bonding pads formed on said pad-mounting surface; and
   a multi-level interconnect structure formed on said pad-mounting surface, and including
   a first insulating layer formed on said pad-mounting surface and formed with a plurality of first holes, each of which exposes a respective one of said first bonding pads from said pad-mounting surface,
   a plurality of first level conductive horizontal bodies, each of which has an end section that fills a respective one of said first holes to electrically connect with a respective one of said first bonding pads, and an extension that extends from said end section, that is formed on said first insulating layer, and that has a connecting end horizontally offset from the respective one of said first holes,
   a second insulating layer formed on said first insulating layer and formed with a plurality of first holes, each of which exposes said connecting end of said extension of a respective one of said first level conductive horizontal bodies from said second insulating layer, and a plurality of second level conductive vertical bodies, each of which fills a respective one of said first holes in said second insulating layer to electrically connect with said connecting end of said extension of a respective one of said first level conductive horizontal bodies, and each of which has a connecting end that extends through the respective one of said first holes in said second insulating layer.

2. The semiconductor device of claim 1, further comprising a third insulating layer formed on said second insulating layer and formed with a plurality of first holes, said connecting end of each of said second level conductive vertical bodies extending into a respective one of said first holes in said third insulating layer.

3. The semiconductor device of claim 2, further comprising a plurality of conductive bumps, each of which extends into a respective one of said first holes in said third insulating layer, and each of which is electrically connected to said connecting end of a respective one of said second level conductive vertical bodies.

4. The semiconductor device of claim 1, wherein said semiconductor die further has a plurality of spaced apart second bonding pads formed on said pad-mounting surface, said first insulating layer being further formed with a plurality of second holes, each of which exposes a respective one of said second bonding pads from said first insulating layer, said semiconductor device further comprising a plurality of first level conductive vertical bodies, each of which fills a respective one of said second holes in said first insulating layer to electrically connect with a respective one of said second bonding pads, and each of which has a connecting end that extends through the respective one of said second holes in said first insulating layer.

5. The semiconductor device of claim 4, wherein said second insulating layer is further formed with a plurality of second holes, each of which exposes said connecting end of a respective one of said first level conductive vertical bodies from said second insulating layer, said semiconductor device further comprising a plurality of second level conductive horizontal bodies, each of which has an end section that fills a respective one of said second holes in said second insulating layer to electrically connect with said connecting end of a respective one of said first level conductive vertical bodies, and an extension that extends from said end section of a respective one of said second level conductive horizontal bodies, that is formed on said second insulating layer, and that has a connecting end horizontally offset from the respective one of said second holes in said second insulating layer.

6. The semiconductor device of claim 5, further comprising a third insulating layer formed on said second insulating layer and formed with a plurality of first and second holes, said connecting end of each of said second level conductive vertical bodies extending into a respective one of said first holes in said third insulating layer, said connecting end of said extension of each of said second level conductive horizontal bodies extending into a respective one of said second holes in said third insulating layer.

7. The semiconductor device of claim 6, further comprising a plurality of first and second conductive bumps, each of said first conductive bumps extending into a respective one of said first holes in said third insulating layer to electrically connect with said connecting end of a respective one of said second level conductive vertical bodies, each of said second conductive bumps extending into a respective one of said second holes in said third insulating layer to electrically connect with said connecting end of said extension of a respective one of said second level conductive horizontal bodies.

8. The semiconductor device of claim 7, further comprising a first metal layer that is formed on a respective one of said first bonding pads and that is disposed within a respective one of said first holes in said first insulating layer, each of said first level conductive horizontal bodies including a conductive paste layer that has a first portion extending from said first metal layer, and a second portion formed on said first insulating layer, and a second metal layer formed on and cooperating with said second portion of said conductive paste layer to define said extension of the respective one of said first level conductive horizontal bodies.

9. A method for making a semiconductor device that includes a semiconductor die having a pad-mounting surface defining a horizontal plane and a plurality of first bonding pads formed on the pad-mounting surface, the method comprising the steps of:

forming a first insulating layer on the pad-mounting surface;

forming a plurality of first holes in said first insulating layer, each of said first holes exposing a respective one of the first bonding pads from said first insulating layer;

forming a plurality of first level conductive horizontal bodies, each of which has an end section that fills a respective one of said first holes to electrically connect with a respective one of the first bonding pads, and an extension that extends from said end section, that is formed on said first insulating layer, and that has a connecting end horizontally offset from the respective one of said first holes;

forming a second insulating layer on said first insulating layer;

forming a plurality of first holes in said second insulating layer, each of said first holes in said second insulating layer exposing said connecting end of said extension of a respective one of said first level conductive horizontal bodies; and forming a plurality of second level conductive vertical bodies, each of which is electrically connected to said connecting end of said extension of a respective one of said first level conductive horizontal bodies, each of which fills a respective one of said first holes in said second insulating layer, and each of which has a connecting end that extends through the respective one of said first holes in said second insulating layer.

10. The method of claim 9, further comprising forming a third insulating layer on said second insulating layer, and forming a plurality of first holes in said third insulating layer such that said connecting end of each of said second level conductive vertical bodies extends into a respective one of said first holes in said third insulating layer.

11. The method of claim 10, further comprising forming a plurality of conductive bumps, each of which extends into a respective one of said first holes in said third insulating layer, and each of which is electrically connected to said connecting end of a respective one of said second level conductive vertical bodies.

12. The method of claim 9, the semiconductor die further having a plurality of spaced apart second bonding pads formed on the pad-mounting surface, further comprising:

forming a plurality of second holes in said first insulating layer, each of said second holes in said first insulating layer exposing a respective one of the second bonding pads from said first insulating layer; and forming a plurality of first level conductive vertical bodies, each of which fills a respective one of said second holes in said first insulating layer to electrically connect with a respective one of the second bonding pads, and each of which has a connecting end that extends through the respective one of said second holes in said first insulating layer.

13. The method of claim 12, further comprising:

forming a plurality of second holes in said second insulating layer, each of said second holes in said second insulating layer exposing said connecting end of a respective one of said first level conductive vertical bodies from said second insulating layer; and forming a plurality of second level conductive horizontal bodies, each of which has an end section that fills a respective one of said second holes in said second insulating layer to electrically connect with said connecting end of a respective one of said first level conductive vertical bodies, and an extension that extends from said end section of a respective one of said second level conductive horizontal bodies, that is formed on said second insulating layer, and that has a connecting end horizontally offset from the respective one of said second holes in said second insulating layer.

14. The method of claim 13, further comprising forming a third insulating layer on said second insulating layer, and forming a plurality of first and second holes in said third insulating layer such that said connecting end of each of said second level conductive vertical bodies extends into a respective one of said first holes in said third insulating layer, and that said connecting end of said extension of each of said second level conductive horizontal bodies extends into a respective one of said second holes in said third insulating layer.

15. The method of claim 14, further comprising forming a plurality of first and second conductive bumps such that each of said first conductive bumps extends into a respective one of said first holes in said third insulating layer to electrically connect with said connecting end of a respective one of said second level conductive vertical bodies, and that each of said second conductive bumps extends into a respective one of said second holes in said third insulating layer to electrically connect with said connecting end of said extension of a respective one of said second level conductive horizontal bodies.

16. A semiconductor device comprising:

a semiconductor die having a pad-mounting surface defining a horizontal plane, and a plurality of spaced apart first and second bonding pads formed on said pad-mounting surface; and a multi-level interconnect structure formed on said pad-mounting surface, and including a first insulating layer formed on said pad-mounting surface, a plurality of first level conductive horizontal bodies, each of which extends from a respective one of said first bonding pads through said first insulating layer, and each of which has one end connected to a respective one of said first bonding pads, and an opposite end that is offset from the respective one of said first bonding pads, and a plurality of first level conductive vertical bodies, each of which extends in a direction normal to the horizontal plane from a respective one of said second bonding pads through said first insulating layer, and each of which has one end connected to a respective one of said second bonding pads, and an opposite end that is aligned with the respective one of said second bonding pads in said normal direction;

wherein each of said first level conductive vertical bodies has a projecting area, projected on the horizontal plane, that is disposed within a boundary of the respective one of said second bonding pads.

17. The semiconductor device of claim 16, wherein said multi-level interconnect structure further includes a second insulating layer formed on said first insulating layer, and a plurality of second level conductive vertical bodies, each of which extends through said second insulating layer, and each of which has one end connected to said opposite end of a respective one of said first level conductive horizontal bodies, and an opposite end that is aligned with said opposite end of the respective one of said first level conductive horizontal bodies in said normal direction.

18. The semiconductor device of claim 17, wherein said multi-level interconnect structure further includes a plurality of second level conductive horizontal bodies, each of which extends through said second insulating layer, and each of which has one end connected to said opposite end of a respective one of said first level conductive vertical bodies, and an opposite end that is offset from said opposite end of the respective one of said first level conductive vertical bodies.

19. The semiconductor device of claim 18, wherein said multi-level interconnect structure further includes a third insulating layer formed on said second insulating layer, said opposite end of each of said second level conductive vertical bodies extending into said third insulating layer.

20. The semiconductor device of claim 19, further comprising a plurality of first and second conductive bumps, each of said first conductive bumps extending into said third insulating layer to electrically connect with said opposite end of a respective one of said second level conductive vertical bodies, each of said second conductive bumps extending into said third insulating layer to electrically connect with said opposite end of a respective one of said second level conductive horizontal bodies.

* * * * *